(12) United States Patent
Mueller et al.

(10) Patent No.: US 8,411,356 B2
(45) Date of Patent: Apr. 2, 2013

(54) CATADIOPTRIC PROJECTION OBJECTIVE WITH TILTED DEFLECTING MIRRORS, PROJECTION EXPOSURE APPARATUS, PROJECTION EXPOSURE METHOD, AND MIRROR

(75) Inventors: Ralf Mueller, Aalen (DE); Aksel Goehnermeier, Aalen (DE); Wolfgang Singer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 48 days.

(21) Appl. No.: 13/217,793

(22) Filed: Aug. 25, 2011

(65) Prior Publication Data
US 2011/0304926 A1 Dec. 15, 2011

Related U.S. Application Data

(62) Division of application No. 11/964,527, filed on Dec. 26, 2007, now Pat. No. 8,027,088.

(60) Provisional application No. 60/877,366, filed on Dec. 28, 2006.

(51) Int. Cl.
*G02B 17/08* (2006.01)

(52) U.S. Cl. ........................................... 359/364

(58) Field of Classification Search .................. None
See application file for complete search history.

(56) References Cited

U.S. PATENT DOCUMENTS

| 5,850,309 A | 12/1998 | Shirai et al. |
| 6,728,043 B2 | 4/2004 | Gruner et al. |
| 2003/0234912 A1 | 12/2003 | Omura |
| 2004/0233405 A1 | 11/2004 | Kato et al. |
| 2005/0134826 A1 | 6/2005 | Ulrich et al. |
| 2005/0152046 A1 | 7/2005 | Gruner et al. |
| 2005/0185269 A1 | 8/2005 | Epple et al. |
| 2005/0243435 A1 | 11/2005 | Zaczek et al. |
| 2005/0248856 A1 | 11/2005 | Omura et al. |
| 2005/0254120 A1 | 11/2005 | Zaczek et al. |
| 2005/0270608 A1 | 12/2005 | Shiozawa et al. |

(Continued)

FOREIGN PATENT DOCUMENTS

| DE | 198 51 749 | 5/2000 |
| DE | 103 38 983 | 3/2005 |

(Continued)

OTHER PUBLICATIONS

The Japanese Office Action, with English translation, for corresponding JP Appl No. 2009-543357, dated Jul. 2, 2012.

*Primary Examiner* — Derek S Chapel
(74) *Attorney, Agent, or Firm* — Fish & Richardson P.C.

(57) ABSTRACT

A projection objective has an object surface and an image surface. The projection objective includes a plurality of optical elements arranged along an optical axis and configured so that during operation the projection objective images a pattern arranged in the object surface onto the image surface. The optical elements include a concave mirror a first deflecting mirror and a second deflecting mirror. The first deflecting mirror is tilted relative to the optical axis by a first tilt angle, $t_1$, about a first tilt axis so that during operation the first deflecting mirror deflects light at a wavelength $\lambda$ from the object surface towards the concave mirror or deflects light at $\lambda$ from the concave mirror towards the image surface. The second deflecting mirror is tilted relative to the optical axis by a second tilt angle, $t_2$, about a second tilt axis. For a pattern including a grating having a line width of 45 nm and a pitch, $p$, the projection objective images the pattern to the image surface such that for a first orientation of the pattern and a second orientation of the pattern a difference, $\Delta HV$, between the imaged line width is 1.2 nm or less for 100 nm<$p$<1,000 nm, where the grating lines in the first orientation are orthogonal to the grating lines in the second orientation.

20 Claims, 7 Drawing Sheets

U.S. PATENT DOCUMENTS

| | | |
|---|---|---|
| 2006/0077366 A1 | 4/2006 | Shafer et al. |
| 2006/0170890 A1 | 8/2006 | Ito |
| 2007/0216884 A1 | 9/2007 | Nagasaka |
| 2007/0242244 A1 | 10/2007 | Nagasaka |

FOREIGN PATENT DOCUMENTS

| | | |
|---|---|---|
| EP | 1 001 295 | 5/2000 |
| EP | 1 602 981 | 12/2005 |
| EP | 1 767 978 A1 | 3/2007 |
| JP | 10-160915 | 6/1998 |
| JP | 2005-537676 | 12/2005 |
| JP | 2006-100429 | 4/2006 |
| JP | 2006-210715 | 8/2006 |
| JP | 2006-227099 | 8/2006 |
| WO | WO 2004/019105 | 3/2004 |
| WO | WO 2004/025370 | 3/2004 |
| WO | WO 2005/040890 | 5/2005 |
| WO | WO 2005/111689 | 11/2005 |
| WO | WO 2005/119369 | 12/2005 |
| WO | WO 2005/124420 | 12/2005 |
| WO | WO 2007/094407 | 8/2007 |
| WO | WO 2007/100087 | 9/2007 |
| WO | WO 2007/119466 | 10/2007 |

CATADIOPTRIC PROJECTION OBJECTIVE WITH TILTED DEFLECTING MIRRORS, PROJECTION EXPOSURE APPARATUS, PROJECTION EXPOSURE METHOD, AND MIRROR

CROSS-REFERENCE TO RELATED APPLICATIONS

This application is a divisional of, and claims priority under 35 USC 120 to, U.S. application Ser. No. 11/964,527, filed Dec. 26, 2007, which claims priority under 35 USC 119(e) to U.S. Patent Application No. 60/877,366, filed on Dec. 28, 2006. The entire contents of U.S. application Ser. No. 11/964,527 and U.S. Patent Application No. 60/877,366 are incorporated herein by reference.

BACKGROUND

The disclosure relates to a catadioptric projection objective including a plurality of optical elements arranged to image a pattern arranged in an object surface of the projection objective onto an image surface of the projection objective. The disclosure further relates to a projection exposure apparatus, a projection exposure method employing such projection objective, and a mirror.

Microlithographic processes are commonly used in the manufacture of semiconductor elements, such as integrated circuits (ICs) liquid crystal elements, micropatterned members and micromechanical components.

A projection exposure apparatus used for photolithography generally typically includes an illumination system configured to transform primary light from a light source into illumination light, and a projection objective. Light from the illumination system illuminates a reticle (or mask) having a given pattern, and the projection objective transfers an image of the pattern onto a region of a photo-sensitive substrate arranged in the image surface of the projection objective. Projection is typically performed with high resolution on a reduced scale to produce a demagnified image of the reticle pattern on the substrate.

In optical lithography, high resolution and good correction status of chromatic aberrations and other aberrations have to be obtained for a relatively large, virtually planar image field. Concave mirrors have been used for some time to help solve problems of chromatic correction and image flattening. A concave mirror has positive power, like a positive lens, but the opposite sign of Petzval curvature. Also, concave mirrors do not introduce chromatic aberrations. Therefore, catadioptric systems that combine refracting and reflecting elements, particularly lenses and at least one concave mirror, are often employed for configuring high-resolution projection objectives for microlithography using ultraviolet light.

Unfortunately, a concave mirror can be difficult to integrate into an optical design, since it sends the light right back in the direction it came from. Intelligent designs integrating concave mirrors are desirable.

Some catadioptric projection objectives allowing high image-side numerical aperture (NA) and a good correction status can include two or more cascaded (or concatenated) imaging objective parts and one or more intermediate images. One class of concatenated systems designed for use with off-axis fields to obtain an image free of vignetting and obscuration uses a single concave mirror positioned at or optically close to the pupil surface of a catadioptric objective part in combination with one or more negative lenses arranged ahead of the concave mirror to correct axial chromatic aberration (CHL) and Petzval sum. Typically, such projection objectives have a first deflecting mirror tilted relative to the optical axis, which mirror is used either to deflect the light coming from the object surface towards the concave mirror or in order to deflect the light reflected by the concave mirror toward downstream objective parts. A second deflecting mirror oriented at right angles with respect to the first deflecting mirror may be provided in order to parallelize the object plane and the image plane.

Representative examples for folded catadioptric projection objectives using planar deflecting mirrors in combination with a single concave mirror are disclosed, for example in US 2006/0077366 A1, US 2003/0234912 A1, US 2005/0248856 A1, US 2004/0233405 A1 or WO 2005/111689 A2.

In order to ensure that the deflecting mirrors have a high reflectivity, they are customarily coated with a reflective coating, usually designed as multiple dielectric layers (dielectric multilayer stack) or as a combination of metallic and dielectric layers. The reflectivity for light incident on and reflected by such mirrors is typically influenced in a polarization-dependent manner if dielectric layers are operated at high angles of incidence. Furthermore, as the image-side numerical aperture NA of projection objectives increases, the range of angles of incidence of light incident on a deflecting mirror (also denoted as spectrum of angles of incidence) may increase. For example, in projection objectives designed for immersion lithography at NA>1 angles of incidence given on a deflecting mirror tilted by 45° to the optical axis may range from about 30° to about 60°.

It would be desirable to have deflecting mirrors having reflective coatings with a high reflectivity (for example 90% or above) which is essentially constant for all angles of incidence occurring at the deflecting mirror and with a negligible polarization-dependence of reflectivity. Using such "ideal" reflective coating could eliminate negative influence of the deflecting mirrors on the intensity distribution and polarization distribution of light within a projection beam in such catadioptric systems. However, such "ideal" reflective coatings are presently not available.

It has been found that, under certain imaging conditions in such catadioptric systems, structure lines having different orientation contained in the pattern to be imaged are projected with different efficiency. These orientation-dependent differences for various structure directions are also referred to as H-V differences (horizontal-vertical differences) or as variations in the critical dimensions (CD variations) and can be observed as differering line widths for the different structure directions in the photoresist.

In certain microlithography techniques, the pattern of the mask is illuminated with light from an effective source formed by an intensity distribution at a pupil plane of the illumination system corresponding to a particular illumination mode. The illumination modes include conventional illumination modes with various degrees of coherence (defined e.g. by parameter σ) and non-conventional illumination modes applying off-axis illumination. Off-axis illumination modes may be preferred when the critical dimensions desired for a particular lithography process are becoming very close to the theoretical resolution limit of the exposure system. With off-axis illumination, a mask providing a pattern is illuminated at oblique (non-perpendicular) angles, which may improve resolution, but particularly improves the process latitude by increasing the depth of focus (DOF) and/or contrast. One known off-axis illumination mode is annular, in which the conventional zero order spot on the optical axis is modified to a ring-shape intensity distribution. Another mode is multipole illumination, in which the intensity distribution at a pupil plane of the illumination system forming the effective source is characterized by several poles which are not on the optical axis (off-axis). Dipole illumination is frequently used for printing patterns having one predominant periodicity direction. Quadrupole illumination using four off-axis illumination poles may be used where a pattern contains sub-patterns of orthogonal lines along mutually perpendicular directions (sometimes denoted as horizontal and vertical lines).

Further improvements may be obtained by controlling the polarization state of the illumination light.

SUMMARY

In some embodiments, catadioptric projection objectives are provided that have tilted deflecting mirrors which allows to image patterns including sub-patterns oriented in various directions such that line width variations due to differences of orientation of sub-patterns are largely avoided.

In certain embodiments, catadioptric projection objectives are provided that have tilted deflecting mirrors which allows to image patterns including sub-patterns oriented in various directions such that contrast variations due to differences of orientation of sub-patterns are largely avoided.

In some embodiments, catadioptric projection objectives are provided that have tilted deflecting mirrors which have substantially no negative influence on an intensity distribution in illumination poles in a pupil surface of the projection objective.

The catadioptric projection objectives may be used to perform microlithographic processes in a projection exposure apparatus using ultraviolet light from the deep ultraviolet (DUV) or very deep ultraviolet (VUV) regime.

In general, in a first aspect, the invention features a catadioptric projection objective comprising:

a plurality of optical elements arranged along an optical axis to image a pattern arranged in an object surface of the projection objective onto an image surface of the projection objective, the optical elements including:

a concave mirror;

a first deflecting mirror tilted relative to the optical axis by a first tilt angle $t_1$ about a first tilt axis to deflect light from the object surface towards the concave mirror or to deflect light from the concave mirror towards the image surface;

a second deflecting mirror tilted relative to the optical axis by a second tilt angle $t_2$ about a second tilt axis;

the first deflecting mirror having a first reflective coating with reflectivity $R_s^1(\alpha_1)$ for s-polarized light and a reflectivity $R_p^1(\alpha_1)$ for p-polarized light incident on the first deflecting mirror at first angles of incidence $\alpha_1$ from a first range of angles of incidence according to $(t_1-\Delta\alpha_1) \leq \alpha_1 \leq (t_1+\Delta\alpha_1)$;

the second deflecting mirror having a second reflective coating with a reflectivity $R_s^2(\alpha_2)$ for s-polarized light and a reflectivity $R_p^2(\alpha_2)$ for p-polarized light incident on the second deflecting mirror at second angles of incidence $\alpha_2$ from a second range of angles of incidence according to $(t_2-\Delta\alpha_2) \leq \alpha_2 \leq (t_2+\Delta\alpha_2)$;

wherein a first reflectivity sum, $R_s^{PE}$, for s-polarized light of polar edge rays accumulated upon reflection on the first and second deflecting mirrors is substantially equal to a second reflectivity sum, $R_p^E$ for p-polarized light of equatorial edge rays accumulated upon reflection on the first and second deflecting mirrors.

Generally, the reflectivity R of each of the first and second deflecting mirror depends on the direction of polarization of light components incident on that mirror (e.g. s-polarization or p-polarization) and on the angles of incidence ($\alpha$) of rays incident on the mirror. Theses dependencies are given by parameters $R_s^1(\alpha)$, $R_s^2(\alpha)$, $R_p^1(\alpha)$ and $R_p^2(\alpha)$), respectively, where indices 1 and 2 denote the respective deflecting mirror. Where the incident beam has a finite opening angle (determined by the numerical aperture of the beam at the position of the respective deflecting mirror) the spectrum of angles of incidence falling on a deflecting mirror is substantially centered about an incidence angle corresponding to the tilt angle of the corresponding deflecting mirror. The range of angles of incidence on the respective deflecting mirror extends between a minimum angle of incidence ($\alpha_{MIN}$) and a maximum angle of incidence ($\alpha_{MAX}$) differing from the center value ($\alpha$=tilt angle t) by an angular difference $\Delta\alpha$, which value generally depends on the object-side numerical aperture $NA_{OBJ}$ of the projection objective, the magnification ratio $\beta_x$ between the object surface of the projection objective and a field plane closest to the respective deflecting mirror, and parameter $\sigma$ defined by the respective illumination mode according to: $\Delta\alpha$=a $\sin(\sigma^* NA_{OBJ}/\beta_x)$.

Where a deflecting mirror is positioned optically close to the object surface, $\beta_x$=1. Likewise, $\beta_x$ is close to or equal to 1 where the deflecting mirror is close to an intermediate image formed by a relay system having about 1:1 magnification. Values of parameter $\sigma$ (often referred to as coherence factor) are conventionally quoted as the ratio of the radius of the illumination intensity disc in a conventional setting to the radius of the pupil of the illumination system, and therefore take a value between 0 and 1.

Generally, values of $\sigma$ at or close to 1 (e.g. $\sigma \geq 0.7$ and/or $\sigma \geq 0.8$) correspond to pupil positions at or very close to the edge of the pupil of the illumination system. Oblique illumination directions corresponding to those regions close to the pupil edge may be employed to obtain high resolution and contrast in a lithography process. Rays originating from a narrow region close to the edge of the pupil are denoted as "pupil edge rays" in this application. "Pupil edge rays" may be incident on the respective deflecting mirrors with angles of incidence close to the maximum or minimum angle of incidence depending on the orientation of the respective deflecting mirror and the position of the origin of the pupil edge rays relative to the direction of the tilt axis of tilted deflecting mirror. Specifically, where pupil edge rays originate from locations centered about a direction perpendicular to the tilt axis of the deflecting mirror high incidence angles may occur. Those pupil edge rays originating from locations centered about a direction perpendicular to the tilt axis of the deflecting mirror are denoted "polar edge rays" in this application.

In contrast, rays originating from a narrow region of the pupil extending in a direction parallel to the tilt axis of a deflecting mirror and including the optical axis may be incident on the deflecting mirrors at angles of incidence at or close to the respective tilt angle. A narrow region of the pupil extending in a direction parallel to the tilt axis of a deflecting mirror is denoted as "equatorial zone" in this application. The rays originating from the equatorial zone are denoted as "equatorial rays" in this application. For example, where a tilt angle is 45°, equatorial rays may have angles of incidence in a region 45°±5° or 45°±3°, for example. Pupil edge rays originating from the eqatorial zone are denoted "equatorial edge rays" in this application. Rays originating from the equatorial zone at pupil locations at or close to the optical axis are denoted as "pupil center rays" in this application. Those pupil center rays typically originate from a central region with small $\sigma$ value e.g. $\sigma$<0.2 and/or $\sigma$<0.3.

The term "deflecting mirror" denotes a reflective optical element designed to deflect radiation about a predefined angle or a range of angles. A "deflecting mirror" may be a planar mirror, in which case the deflecting mirror is effective to fold the optical axis without introducing other effects on the reflected rays. A planar deflecting mirror does not have optical power. A deflecting mirror may have a surface shape significantly deviating from a plane. For example the surface of the deflecting mirror may be curved in a spherical or aspherical fashion to exert a correcting effect on reflected rays.

Where the reflectivities of the deflecting mirrors are adjusted according to this aspect of the disclosure, it is ensured by the structure and reflectivity characteristics of the reflective coatings of the deflecting mirrors that the subsequent reflections of a light beam at the first and second deflecting mirror does not cause significant differences in intensity between rays originating from polar edge region of the pupil (polar edge rays) and rays incident on the deflecting mirrors only at incidence angles which are at or close to the respective tilt angle, e.g. at or close to 45°, e.g. rays originating from the equatorial zone.

The first reflectivity sum, $R_s^{PE}$ represents reflection losses experienced by the rays having the largest and smallest incidence angles, respectively, on the deflecting mirrors. Those rays are employed in a two-beam interference situation to obtain high contrast and resolution. Also, rays deviating from the extreme values only by a small amount, such as 5° or 4° or 3° or 2° or less, are typically employed to obtain sufficient intensity for the imaging process. Those rays may be included into calculation of $R_s^{PE}$. The second reflectivity sum, $R_p^E$ represents reflection losses suffered by rays incident on the deflecting mirrors and angles of incidence at or close to the respective tilt angle. In general, those rays include rays that propagate in or at a small angle with respect to a plane defined by the optical axis and the tilt axis of the respective deflecting mirrors. The deviations may be smaller than 5° or 4° or 3° or 2°, for example. Those rays my include equatorial edge rays and may include rays propagating along or at a small angle with respect to the optical axis.

If the reflectivities of those selected groups of rays are essentially balanced as described above, intensity inhomogeneities of those rays optically downstream of the deflecting mirrors may be avoided to an extent required for the respective lithography process. In this context, the term "substantially equal" accounts for the fact that average values for relatively narrow angular ranges are typically considered and that it is generally not necessary for the first and second reflectivity sum to be exactly the same. The allowable amount of deviation between the reflectivity sums will typically depend on the sensitivity of the respective lithography process with respect to intensity inhomogeneities in the pupil, such that deviations between the reflectivity sums in the order of 3% or less may be tolerable.

Generally, in this application the sign "%" is to be understood as "percentage points". For example, reflectivities R=90% and R=91% differ by 1 percentage point, i.e. by 1%. The same holds for reflectivities R=50% and R=51%, although the relative difference is larger.

In an embodiment, an effective reflectivity splitting, $\Delta R$, defined as a difference between the first reflectivity sum, $R_s^{PE}$, and the second reflectivity sum, $R_p^E$, according to $\Delta R = R_s^{PE} - R_p^E$, is less than 2%. Here:

$$R_s^{PE} = R_s^1(t_1 - \Delta\alpha_1) + R_s^1(t_1 + \Delta\alpha_1) + R_s^2(t_2 - \Delta\alpha_2) + R_s^2(t_2 + \Delta\alpha_2) \quad (1)$$

and $$R_p^E = 2 * (R_p^1(t_1) + R_p^2(t_2)). \quad (2)$$

The effective reflectivity splitting $\Delta R$ may be 1.5% or less and/or 1% or less in some embodiments.

In general, a finite amount of reflectivity splitting will occur in most cases. Small values close to $\Delta R = 0$ may be obtained if only a narrow spectrum of rays is considered. For example, reflective coatings may be designed such that the reflectivity splitting $\Delta R = 0$ for a pair of angles of incidence $\alpha_{max}$ and $\alpha_{min}$ corresponding to the most critical periodicities of patterns for which the diffraction orders are located in the immediate vicinity of the pupil edge of the projection objective, for example where $\sigma \geq 0.98$. It has been found that intensity ellipticity and corresponding CD variations caused by those uneven intensity distribution may be avoided for a larger spectrum of periodicities in a pattern if a whole range of angles of incidence between the extreme values ($\alpha_{max}$ and $\alpha_{min}$, respectively) and values close to or at the center values (e.g. $\alpha = t$) are considered. According to an embodiment this is possible where a variation $R_s(\alpha)$ of reflectivity for s-polarized light with incidence angle $\alpha$ on at least one of the first and second deflecting mirrors is substantially point symmetric to a reflectivity value $R_s(t)$ at an incidence angle corresponding to the tilt angle of the deflecting mirror such that the condition:

$$R_s(t + \delta\alpha) + R_s(t - \delta\alpha) = R_s(t) \pm 0.5\% \quad (3)$$

holds for all incidence angles $\alpha$ in the range of angles of incidence incident on the respective deflecting mirror, $\delta\alpha$ being the difference between the tilt angle t and the respective angle of incidence $\alpha$. An acceptable deviation from point symmetry in a mathematical sense may be smaller, e.g. $\pm 4\%$ and/or $\pm 0.3\%$ and/or $\pm 0.2\%$. (The sign "%" denotes percentage points reflectivity)

In some embodiment, the conditions expressed by equations (1) to (3) may be considered as minimum requirements to secure superior performance for illumination modes corresponding to tangential polarization in regions at or close to the edge of the pupil, for example in the region $0.7 < \alpha \leq 1$. If it is desired to operate the exposure apparatus using essentially unpolarized light, the condition $$(R_p(t + \delta\alpha) + R_p(t - \delta\alpha))/2 = R_s(t) \pm 2\% \quad (4)$$

should be fulfilled in addition to the conditions of equation (1) and (2). If these conditions are obeyed, intensity ellipticity may be essentially avoided for tangential polarization as well as for radial polarization (e.g., preferred directions of polarization in radial direction of the pupil) and where unpolarized light (e.g., light essentially without preferred direction of polarization) is used.

Where the condition $$(R_s(t - \Delta\alpha) + R_s(t + \Delta\alpha))/2 = R_p(t) \pm 0.5\% \quad (5)$$

is fulfilled for a reflectivity characteristics of a deflecting mirror, a single mirror may be used as a deflecting mirror tilted at a tilt angle t without introducing reflectivity inhomogeneities as described when polarized light is used. Such mirror may be denoted as a "balanced" mirror. A deflecting device having two "balanced" deflecting mirrors with identical coating structure may be used.

If it is desired to use non-polarized light (e.g., light essentially without a preferred polarization direction) for an exposure process, the condition $$(R_p(t - \Delta\alpha) + R_p(t + \Delta\alpha))/2 = R_s(t) \pm 0.5\% \quad (6)$$

relating to the orthogonal polarization direction should be fulfilled in addition to condition (5) if a balanced mirror is desired. Therefore, obeying the conditions (5) and (6) allows to use tangential or radial polarization or depolarized light.

Coatings fulfilling the condition $$R_p(t)=R_s(t)\pm 0.5\% \quad (7)$$

in addition to condition (5) allow to use tangential porarization at the pupil edge and unpolarized light near the center of the pupil (close to the optical axis)

Therefore, the disclosure also relates to a mirror having a mirror substrate and a reflective coating coated onto the substrate, where the reflectivity characteristics of the reflective coating is in accordance with equation (5) or equations (5) and (6) or equations (5) and (7). The mirror may be a planar mirror suitable to be used as a deflecting mirror without optical power to fold an optical axis.

The conditions described above may be utilized as target functions for designing and optimizing the structure of reflective coatings to be used for deflecting mirrors in view of a predefined set of conditions for a desired range of lithography processes. For example, a set of reflective coatings may be optimized for a limited set of illuminations modes, such as dipole illumination or quadropole illumination, in connection with certain preferred polarization conditions, such as tangential polarization. Where other illumination settings are used, a predefined deviation of intensity distribution downstream of the deflecting mirrors may occur. If desired, those deviations may be compensated with additional measures. In some embodiments, the intensity distribution of the effective source within the illumination system is influenced in a target manner to provide an uneven intensity distribution which is adapted to an uneven effect of the reflectivities on the deflecting mirrors such that, in combination, a relatively uniform intensity distribution substantially without intensity ellipticity is obtained downstream with the deflecting mirrors. Suitable techniques for adjusting the intensity distribution in the pupil of the illumination system in a locally resolving manner may include utilizing a variable transmission filter in the region of a pupil surface of the illumination system, utilizing diffractive optical elements providing different diffracting efficiencies for different areas of the illumination pupil, using an arrangement of a plurality planar reflecting surfaces, such as shown in US 2005/0152046 A1, or other measures having similar capability to define in a targeted manner a non-uniform spatial intensity distribution in a pupil surface of an illumination system.

According to another aspect the disclosure relates to a method of fabricating semiconductor devices and other types of microdevices utilizing a catadioptric projection objective comprising;

illuminating the mask with ultraviolet light having a prescribed wavelength;

projecting an image of the pattern onto the photosensitive substrate using a catadioptric projection objective as described above or below.

Mircrostructured devices with a high fidelity between original structures on the mask and imaged structures on a substrate may be obtained.

The disclosure also relates to a projection exposure apparatus comprising:

a light source generating primary light;

an illumination system forming the primary light to generate illumination light incident on a mask bearing a pattern; and a projection objective projecting an image of the pattern onto a light-sensitive substrate, the projection objective being configured essentially as described above or below.

In embodiments, ultraviolet primary light from a wavelength range between 260 nm and 100 nm, such as 193 nm or 157 nm may be employed.

In some embodiments, embodiments may be implemented in projection objectives for dry lithography at NA<1 as well as in projection objectives for immersion lithography, particularly at $NA \geqq 1$. Embodiments may have $NA \geqq 0.80$ and/or $NA \geqq 0.90$ and/or $NA \geqq 1.0$, for example.

The previous and other properties can be seen not only in the claims but also in the description and the drawings, wherein individual characteristics may be used either alone or in sub-combinations as an embodiment of the disclosure and in other areas and may individually represent advantageous embodiments.

DETAILED DESCRIPTION

Figures 1A, 1B:
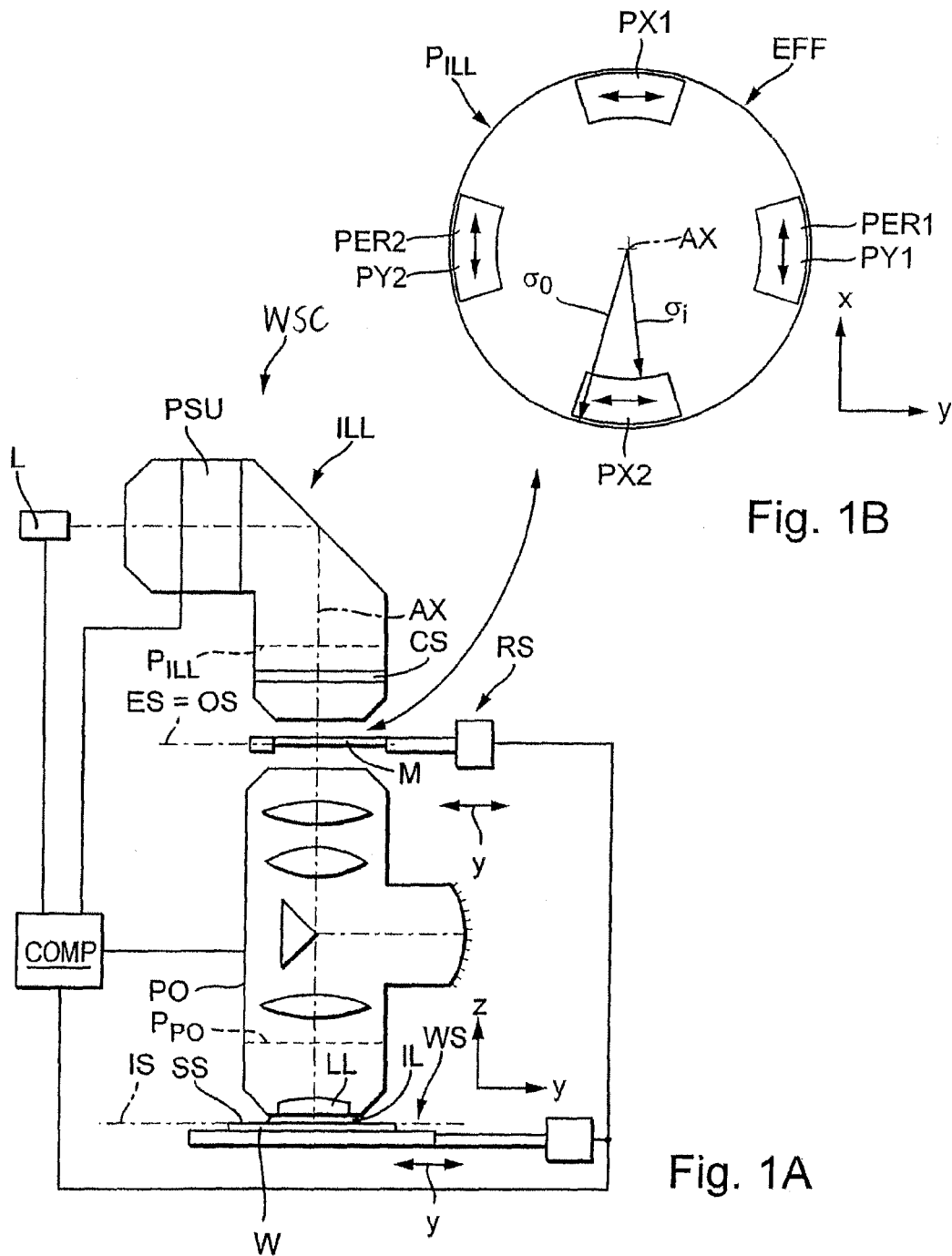
FIG. 1A shows a schematic drawing of an embodiment of a projection exposure apparatus for microlithography having an illumination system and a projection objective.
FIGS. 1B and 1C show axial views of intensity distributions in an effective light source in the pupil surface of the illumination system according to quadrupole illumination mode with tangential polarization.

In the following description of various embodiments, the object involved is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Corresponding features in the figures are designated with like or identical reference identifications to facilitate understanding.

FIG. 1 shows schematically a microlithographic projection exposure apparatus in the form of a wafer scanner WS, which is provided for fabricating large scale integrated semiconductor components in a step-and-scan mode. The projection exposure apparatus comprises as light source an ArF excimer laser L having an operating wavelength of about 193 nm. Other operating wavelengths, such as 248 nm or 157 nm, are also possible. A downstream illumination system ILL generates, in its exit surface ES, a large, sharply delimited, homogeneously illuminated illumination field that is adapted to the telecentric requirements of the downstream catadioptric projection objective PO. The illumination system ILL has devices for selecting the illumination mode and, in the example, can be changed over between conventional on-axis illumination with a variable degree of coherence ($\sigma$), and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask M in such a way that a pattern formed on the mask lies in the exit surface ES of the illumination system coinciding with the object surface OS of the projection objective PO and can be moved in this plane for a scanning operation in a scanning direction (Y-direction) perpendicular to the optical axis AX common to the illumination system and the projection objective (i.e. the Z-direction).

The reduction projection objective PO is designed to image an image of a pattern provided by the mask with a reduced scale of 4:1 (magnification ratio $|\beta|=0.25$) onto a wafer W coated with a photoresist layer at an image side numerical aperture NA>1. The wafer W serving as a light-sensitive substrate is arranged in such a way that the planar substrate surface SS with the photoresist layer essentially coincides with the planar image surface IS of the projection objective. The wafer is held by a device WS (e.g., wafer stage) including a scanner drive in order to move the wafer synchronously with the mask M in parallel with the latter. The device WS also includes manipulators in order to move the wafer both in the Z direction parallel to the optical axis and in the X and Y directions perpendicular to said axis. A tilting device having at least one tilting axis running perpendicular to the optical axis is integrated.

The projection objective PO has a planoconvex last lens LL as the last optical element nearest to the image surface IS, the planar exit surface of said last lens being the last optical surface (exit surface) of the projection objective PO.

The exposure apparatus is configured for immersion lithography at NA>1 and includes an immersion medium guiding system (not shown) to guide a transparent, high index immersion liquid IL, such as pure water or water with additives, into a small gap between the exit surface of the projection objective and the substrate such that the immersion liquid completely covers the substrate surface SS of the wafer at least in the region under exposure and that the exit-side end area of the projection objective is immersed into the immersion liquid while a finite image-side working distance is set correctly. The entire system is controlled by a central computer COMP.

The illumination system ILL includes a pupil shaping unit PSU configured to create an effective light source EFF formed by a predefined intensity distribution at a pupil plane $P_{ILL}$ of the illumination system. The pupil plane $P_{ILL}$ is a Fourier transform surface with respect to the object surface of the projection objective PO, where the mask M is situated. Therefore, the spatial distribution of light intensity of the effective source EFF determines an angular distribution of illumination light incident on the mask M. A condenser system CS is provided to perform the Fourier transformation.

The exit-side pupil surface $P_{PO}$ of the projection objective PO is optically conjugated to the pupil surface $P_{ILL}$ of the illumination system. Therefore, in the absence of a mask, a spatial intensity distribution equivalent to the intensity distribution at the effective source EFF may be formed in the pupil surface $P_{PO}$ of the projection objective. Where a mask bearing a pattern is inserted between the illumination system and the projection objective, the intensity distribution in the pupil plane $P_{PO}$ of the projection objective also contains diffraction information corresponding to the properties of the mask pattern.

Figure 1C:
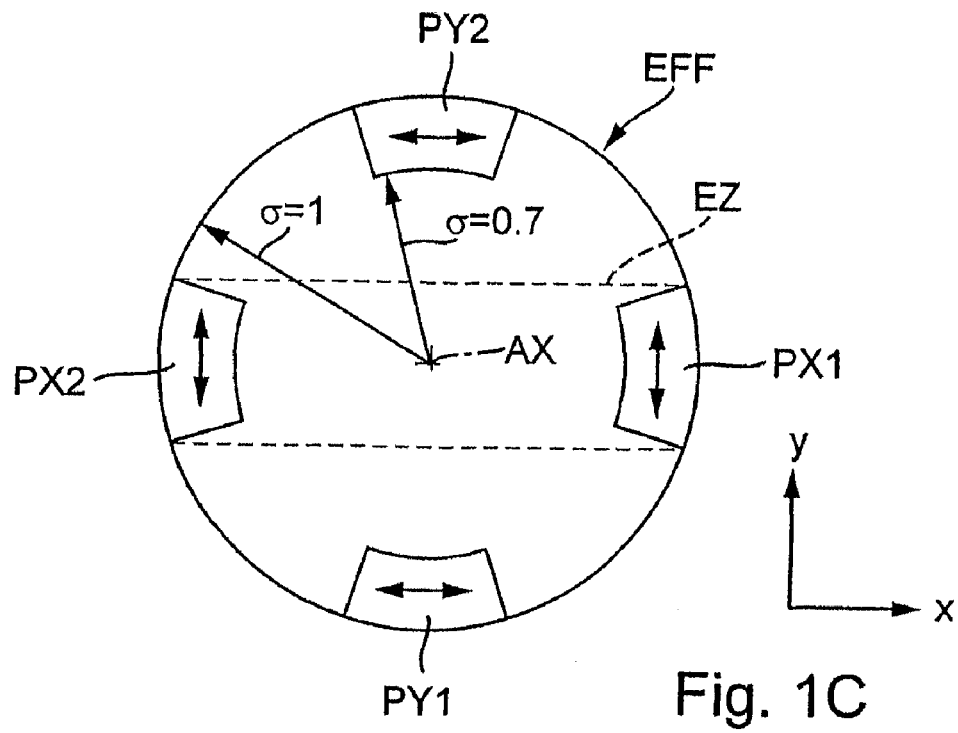
Figure 1D:
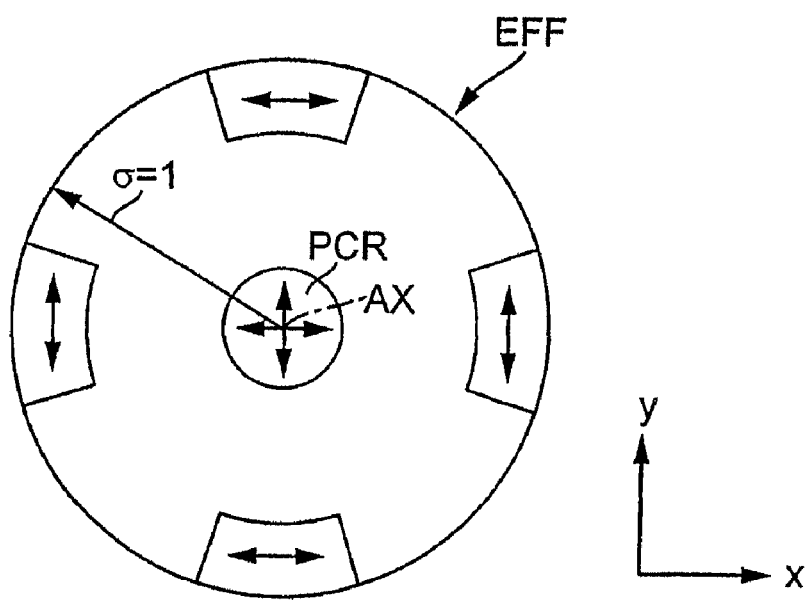
FIG. 1D shows the illumination mode of FIG. 1B, 1C with additional unpolarized intensity on and near the optical axis.

In the situation shown in FIG. 1, the variable optical elements of the pupil shaping unit PSU are adjusted such that the predefined intensity distribution of the effective light source EFF is a quadrupole illumination mode characterized by four off-axis poles PX1, PX2, PY1, PY2, each of the poles having the shape of a segment of a ring and being positioned close to the edge of the pupil (see FIG. 1B to 1D). As used here, the term "pole" refers to a region of given shape and size having relatively high light intensity surrounded by regions with little on no light intensity. The poles extend in radial direction in a $\sigma$ range $\Delta\sigma$ between an inner $\sigma$ value $\sigma_i$ and an outer $\sigma$ value $\sigma_o$ close to 1. The values $\sigma_i$ and $\sigma_o$ are the ratios the inner and outer radii of the poles to the radius of the pupil. In illumination modes adapted to exploit the full resolving power of a projection system $\sigma$ typically ranges between about $\sigma_i=0.7$ and $\sigma_o=0.98$, for example. In the embodiment the poles extend in the azimuthal (circumferential) direction by about 30° to 40°, e.g. about 35°.

Rays originating from a narrow region close to the edge of the pupil (values of $\sigma$ at or close to 1, e.g. $\sigma \geq 0.7$ and/or $\sigma \geq 0.8$) are denoted as "pupil edge rays". "Pupil edge rays" may be incident on the respective deflecting mirrors with angles of incidence close to the maximum or minimum angle of incidence depending on the orientation of the respective deflecting mirror and the position of the origin of the pupil edge rays relative to the direction of the tilt axis of tilted deflecting mirror. Pupil edge rays originating from locations centered about a direction (y-direction) perpendicular to the tilt axis of the deflecting mirror are denoted "polar edge rays" in this application. Therefore, the y-poles PY1 and PY2 correspond to polar edge rays. Consequently, those poles are also denoted as "polar poles".

In contrast, rays originating from a "equatorial zone" EZ of the pupil extending in a direction parallel to the tilt axis of a deflecting mirror (i.e., parallel to the x-direction) and including the optical axis AX may be incident on the deflecting mirrors at angles of incidence at or close to the respective tilt angle. The rays originating from the equatorial zone EZ are denoted as "equatorial rays". Pupil edge rays (e.g., $\sigma \geq 0.7$ and/or $\sigma \geq 0.8$) originating from the eqatorial zone are denoted "equatorial edge rays". Therefore, the x-poles PX1 and PX2 correspond to equatorial edge rays. Consequently, those poles are also denoted as "equatorial poles".

Rays originating from the equatorial zone at pupil locations at or close to the optical axis are denoted as "pupil center rays" in this application (see, e.g., pupil center rays PCR in FIG. 1D). Those pupil center rays typically originate from a central region with small $\sigma$ value, e.g., $\sigma < 0.2$ and/or $\sigma < 0.3$.

Light emerging from the poles PX1, PX2, positioned generally along the x-direction (also denoted as "x-poles" or "equatorial poles") is primarily effective to image sub-patterns of the mask generally extending in y-direction. These patterns are sometimes denoted as "vertical lines", and the corresponding x-poles as "vertical poles". Light emerging from the poles PY1 and PY2 lying along the y-direction (also denotes as "y-poles" or "horizontal poles" or "polar poles") are predominantly effective to image sub-patterns having predominantly features in the x-direction (sometimes denoted as "horizontal lines").

The illumination system is equipped with a polarization influencing arrangement allowing to adjust the state of polarization of light in the effective source EFF. In embodiments, the polarization state is adjusted to obtain "tangential polarization", where the preferred direction of oscillation of the electric field vector is generally in a tangential direction (perpendicular to a radial direction) as indicated by double-arrows. Where tangential polarization is used, the preferred polarization direction is generally perpendicular to a plane defined by the optical axis and the propagation direction of light originating from the off-axis poles, whereby an efficient interference is obtained particularly at high image-side NA, such as NA>1 obtainable in immersion operation.

Locations of a first pupil edge ray PER1 emerging from the outer edge of pole PY1 and a second pupil edge ray PER2 emerging from the other edge of the pole PY2 are indicated in FIG. 1B. The pupil edge rays PER1 and PER2 are representative for illumination directions utilized in a lithography process when two-beam interference is desired to obtain an image of the critical structures of a pattern, i.e., the structures having the smallest periodicity length requiring lithography at the resolution limit of the projection objective.

Figure 2:
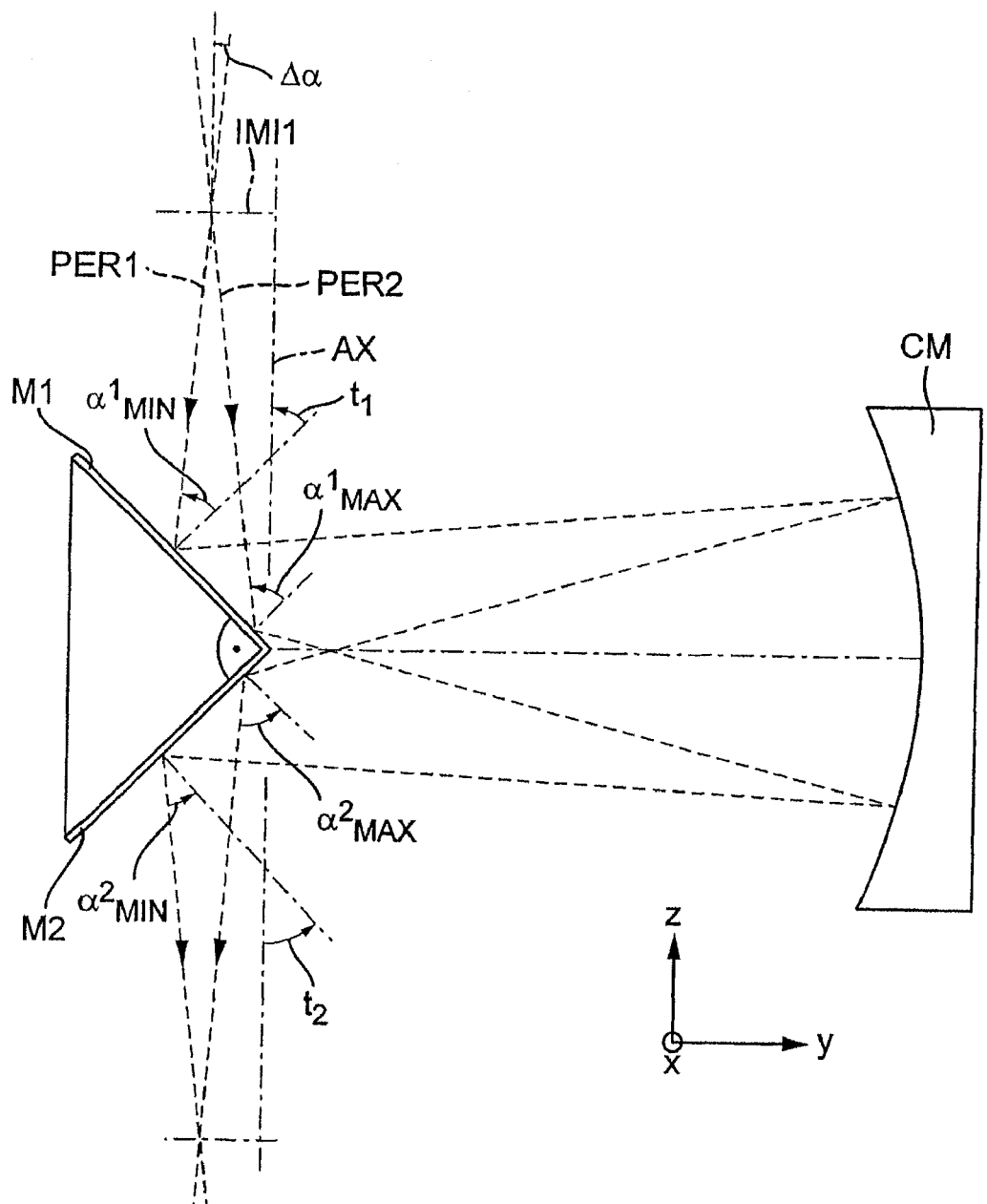
FIG. 2 shows a schematic detail of a section of a catadioptric projection objective having a single concave mirror and two deflecting mirrors guiding light towards and from the concave mirror.

FIG. 2 shows a schematic detail of a section of a catadioptric projection objective having a single concave mirror CM positioned at a pupil surface of the projection objective. A planar first deflecting mirror M1 tilted relative to the optical axis AX around a first tilt axis parallel to the x direction by a first tilt angle $t_1=45°$ is provided to deflect the light coming from the object surface towards the concave mirror. The second deflecting mirror tilted relative to the optical axis by a second tilt angle $t_2=45°$ about a second tilt axis parallel to the first tilt axis (i.e. parallel to the x-direction) is provided to deflect light coming from the concave mirror towards the image surface. The planar reflecting surfaces of the reflecting mirrors are oriented perpendicular to each other such that object surface and image surface are parallel to each other.

As used herein, the "tilt angle" of a deflecting mirror is defined as the angle between the optical axis at the deflecting mirror and the normal to the surface of the flat reflecting mirror surface. The angle of incidence is defined as the angle between the direction of light incident on the deflecting mirror and the normal to the surface. For light incident parallel to the optical axis, the angle of incidence therefore corresponds to the tilt angle of the deflecting mirror. For light with an s-polarization, the electric field vector oscillates perpendicularly to the incidence plane which contains the incident direction and the normal to the surface of the deflecting mirror, while for p-polarized light the electric field vector oscillates parallel to this incidence plane.

Light coming from the object surface and/or from an intermediate image IMI1 upstream of the deflecting mirrors is incident on each of the deflecting mirrors M1, M2 over a range of angles of incidence defined by the numerical aperture of the light beam in the region of the deflecting mirrors and by the orientation of the deflecting mirrors relative to the impinging rays. The largest and the smallest angles of incidence in each case correspond to the rays originating from the outermost edge of the effective source EFF in the region at or near the edge of the illumination pupil. As evident from FIG. 2, pupil edge ray PER1 drawn in broken line is incident on the first reflecting mirror M1 with a relatively small angle of incidence $\alpha_{MIN}^1$ smaller than the tilt angle, for example at about 31°. After reflection at the first deflecting mirror M1 and the concave mirror, the ray PER1 is incident on the second deflecting mirror M2 at a relatively large angle of incidence $\alpha_{MAX}^2$ which is larger than the tilt angle, and which may be about 59°, for example. Pupil edge ray PER2 originating from the opposite position of the pupil is firstly incident on the first deflecting mirror M1 at a relatively large angle of incidence $\alpha_{MAX}^1 > t_1$, for example at about 59°, whereas the corresponding angle of incidence $\alpha_{MIN}^2$ at the second deflecting mirror M2 is smaller than the second tilt angle $t_2$ (e.g., about 31°).

On the other hand, rays originating from the x-poles PX1 and PX2 (i.e., equatorial edge rays) are incident on both deflecting mirrors at a relatively small range of angles of incidence around the tilt angles of the deflecting mirrors. In the embodiments, the range of angles of incidence of these rays may be 45°±5° and/or 45°±4° and/or 45°±3° and/or 45°±2°, for example.

The preferred polarization directions of the light from the poles at tangential polarization (FIG. 1B) effects that the oscillation direction of electric field of the pupil edge rays PER1 and PER2 is perpendicular to the plane of incidence, e.g., the light is s-polarized light upon reflection on the deflecting mirrors. In contrast, light from the x-poles PX1, PX2 (equatorial poles) is effective as p-polarized light upon reflection on the deflecting mirrors since the electric field vector oscillates essentially in the plane of incidence.

Figure 3:
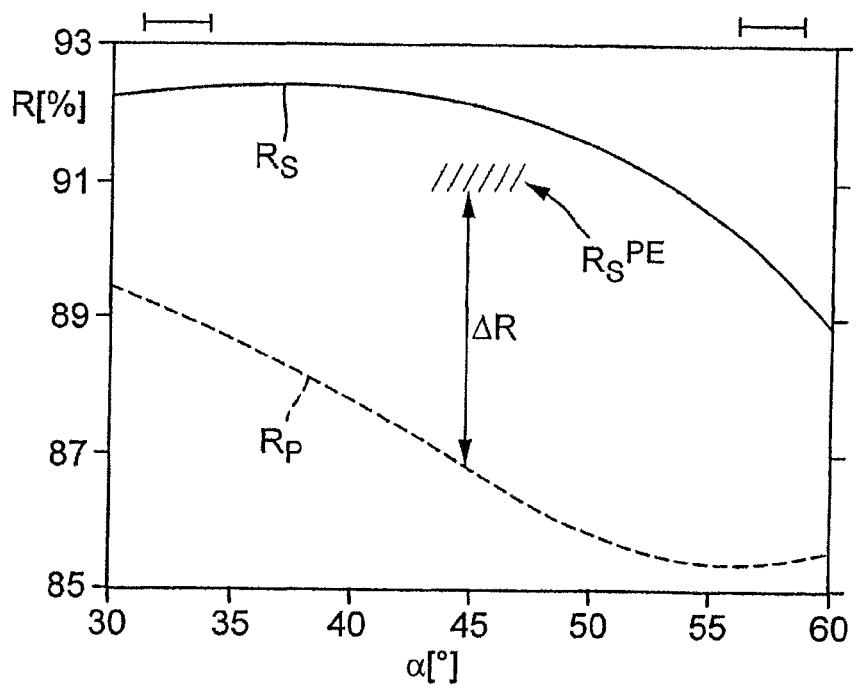
FIG. 3 is a diagram showing the dependency of reflectivities $R_s$ and $R_p$ for s-polarized and p-polarized light, respectively, on the angle of incidence $\alpha$, at a deflecting mirror coated with a conventional reflective coating.

Now consider the overall reflection losses accumulated for the various rays upon subsequent reflections on the first and second deflecting mirrors. For each ray, the accumulated reflection loss is determined by the sum of respective reflectivities for that rays on the first and second deflecting mirror. In order to illustrate consequences of reflection losses, FIG. 3 shows a typical example of a variation of polarization-dependent reflectivities with angles of incidence for a prior art system (see, e.g., WO 2005/124420 A1). In those conventional reflective coatings, the reflectivity $R_s$ for s-polarization is generally substantially larger than for p-polarization. Typically, the reflectivity $R_p$ for p-polarization decreases as the angle of incidence increases and attains a local minimum at the Brewster angle, which is typically found in the region between 50° and 60° angle of incidence.

Assuming that the reflective coatings on both deflecting mirrors have similar reflectance properties, both pupil edge rays will be attenuated essentially in the same manner since the sequence of reflection has little or no influence on the overall attenuation suffered upon the subsequent reflections. The reflection losses of the pupil edge rays may be described by a first reflectivity sum, $R_s^{PE}$ according to:

$$R_s^{PE} = R_s^1(t_1 - \Delta\alpha_1) + R_s^1(t_1 + \Delta\alpha_1) + R_s^2(t_2 - \Delta\alpha_2) + R_s^2(t_2 + \Delta\alpha_2)$$

as explained in connection with FIG. 2. The reflections of the pupil edge rays PER1, PER2 occur either in an angle of incidence region close to the minimum value (e.g., between 31° and 29°) or in the region of maximum angle of incidence (e.g., between 57° and 59°). In the region 30°<α<35° the average reflectivity $R_s$ is about 92.5%. In the region 57°<α<59° the average reflectivity $R_s$ is about 90%. Therefore, a quarter of the first reflectivity sum according to the above definition is about 91%, which is indicated by the hatched region in FIG. 3. On the other hand, a quarter of the second reflectivity sum $R_s^E$ defined as:

$$R_p^C = 2*(R_p^1(t_1) + R_p^2(t_2)).$$

is about 87% since $t_1 = t_2 = 45°$ and $R_p(45°) = 87\%$. As a result, an effective reflectivity splitting $\Delta R = R_s^{PE} - R_p^C$ is about 4 percentage points in the prior art system depicted in FIG. 3.

In terms of accumulated light loss for different rays emanating from the four poles of FIG. 1B the following situation would result. Light emanating from the y-poles PY1, PY2 (polar poles) will accumulate reflectivity losses according to the reflectivities in the region of relatively high angles of incidence (close to about 60°) and relatively low angles of incidence (close to about 30°). The accumulated light loss is expressed by the value of the first reflectivity sum $R_s^{PE}$. The light loss for rays emanating from the x-poles PX1, PX2 (equatorial poles) centred about the x-direction in the equatorial zone is significantly different as light losses are generally determined by the value $R_p$ (45°) of the reflectivity for p-polarized light around 45°. As a result, the intensity distribution at a pupil plane $P_{PO}$ in the projection objective (optically conjugated to the pupil plane $P_{ILL}$ of the illumination system) has different intensities in the poles lying around the y-direction and the poles lying around the x-direction, where the poles in x-direction exhibit smaller average intensities due to the larger light losses upon the subsequent reflections on the deflecting mirrors.

The difference in intensity between the x-poles (vertical poles, poles in x-direction, equatorial poles) and the y-poles (horizontal poles, poles in y-direction, polar poles) is denoted as "intensity ellipticity" in the following. The intensity ellipticity correlates to the difference in reflectivity of $R_p$ at about 45° for the horizontal poles and the average value of the reflectivities for angles of incidence corresponding to the pupil positions in the y-direction. The intensity ellipticity will cause or contribute to direction-dependent line width differences (also denoted CD variations) if the intensity differences between the different poles are greater than an acceptable threshold value, which value may depend on the specific lithography process.

Intensity ellipticity caused by uneven reflection losses on deflecting mirrors may be avoided by providing deflecting mirrors with reflective coatings having an angular dependence of reflectance accounting for the effects mentioned above. Reflective properties of an embodiment of a reflective coating which may be used on both the first and the second deflecting mirror are now explained in connection with FIG. 4. The structure of the multi-layer reflective coating is given in Table 1 below.

TABLE 1

| Layer # | d [nm] | material | n(193 nm) | k(193 nm) |
|---|---|---|---|---|
| 0 | 70 | Al | 0.11 | 2.2 |
| 1 | 30.1 | Chiolith | 1.39 | 0 |
| 2 | 27.6 | Al2O3 | 1.82 | 0.0045 |
| 3 | 43.8 | Chiolith | 1.39 | 0 |
| 4 | 27.5 | Al2O3 | 1.82 | 0.0045 |
| 5 | 44.2 | Chiolith | 1.39 | 0 |
| 6 | 27.2 | Al2O3 | 1.82 | 0.0045 |
| 7 | 44.9 | Chiolith | 1.39 | 0 |
| 8 | 26.7 | Al2O3 | 1.82 | 0.0045 |
| 9 | 45.7 | Chiolith | 1.39 | 0 |
| 10 | 26.1 | Al2O3 | 1.82 | 0.0045 |
| 11 | 46.7 | Chiolith | 1.39 | 0 |
| 12 | 25.4 | Al2O3 | 1.82 | 0.0045 |
| 13 | 47.4 | Chiolith | 1.39 | 0 |
| 14 | 24.5 | Al2O3 | 1.82 | 0.0045 |
| 15 | 46.5 | Chiolith | 1.39 | 0 |
| 16 | 23.8 | Al2O3 | 1.82 | 0.0045 |
| 17 | 41.0 | Chiolith | 1.39 | 0 |
| 18 | 21.4 | Al2O3 | 1.82 | 0.0045 |
| 19 | 23.1 | Chiolith | 1.39 | 0 |
| 20 | 13.0 | Al2O3 | 1.82 | 0.0045 |
| 21 | 28.7 | Chiolith | 1.39 | 0 |
| 22 | 25.8 | Al2O3 | 1.82 | 0.0045 |
| 23 | 38.3 | Chiolith | 1.39 | 0 |

In table 1, the first column indicates the number of the respective layer of the reflective coating from the substrate side (layer 0) towards the free surface of the reflective layer (23). The other columns show the geometrical thickness d [nm] of the layers, the respective material, and parameters n and k defining the complex refractive index N=n−ik of the material, where n is the real part of the complex refractive index and k is the imaginary part of the complex refractive index. The dimensionless absorption coefficient k, which is sometimes also referred to as the extinction coefficient, is related to the dimensional absorption coefficient α [1/cm] by the relation k=(αλ)/4π, where λ represents the corresponding wavelength of the light.

The aluminium material forming the substrate-side layer of the multilayer reflective coating combines relatively high reflectivity with sufficient stability against degrading influence of the high-energy ultraviolet light. Other metals are also possible, for example magnesium, iridium, tin, beryllium or ruthenium, or alloys thereof. Layers 1 to 23 form a dielectric multilayer stack with alternate layers of low refractive index material (here Chiolith) and high refractive index material (here Al$_2$O$_3$). Other materials or material combinations may be used, for example including magnesium fluoride (MgF$_2$), aluminum fluoride (AlF$_3$), chiolite, cryolite, gadolinium fluoride (GdF$_3$), silicon dioxide (SiO$_2$), lanthanum fluoride (LaF$_3$) or erbium fluoride (ErF$_3$).

The variation of reflectivity $R_s$ for s-polarized light with angle of incidence is substantially point symmetric to reflectivity value $R_s$ at α=45° e.g. at the angle of incidence corresponding to the tilt angle t of the deflecting mirror. Here, $R_s(45°)≈93\%$. As the angle of incidence deviates from the tilt angle value towards higher angles of incidence, the reflectivity decreases about linearly (average amount of slope about 0.2% reflectivity per degree of angle of incidence) up to about $R_s$=91.5% at about α=54°, where the local minimum of reflectivity occurs. A slight increase of reflectivity $R_s$ up to about 92% at α=60° occurs above the local minimum. In contrast, the reflectivity $R_s$ increases as the angles of incidence deviate to smaller values from the value at 45° with an approximately linear increase to about 94.3% at about α=34°, where a local maximum of reflectivity for s-polarized light occurs. In general, the condition $$R_s(t+\delta\alpha)+R_s(t-\delta\alpha)=R_s(t)\pm0.5\%$$

is obeyed for δα from 0° to 15°.

The reflectivity $R_p$ for p-polarized light corresponds to the reflectivity $R_s$ for s-polarized light in the region around α=45°, with typical values $R_p$(45°) around 93%. As the angles of incidence deviate more and more from the tilt angle value, values for $R_p$ rapidly decrease towards relatively small values around 91% for a smallest incidence angle (α=30°) and substantially smaller values below 90% at the higher angles of incidence up to 60°. (Note that these small values may be tolerated since no p-polarized light is used at the highest or lowest angles of incidence in the off-axis illumination settings discussed here. This allows additional degrees of freedom for the coating design and facilitates tailoring an optimized performance for $R_s(\alpha)$).

These reflectivity characteristics allow to practically avoid intensity ellipticity caused by subsequent reflections on the deflecting mirrors. As explained above, the first reflectivity sum $R_s^{PE}$ determines the accumulated intensity losses encountered by the light originating from the y-poles PY1, PY2 around the y-direction. Whereas the average reflectivities for the lowest angles of incidence between 29° and 31° is about 94%, the reflectivities on the high angle end of the angular spectrum at about 57° to 59° is about 92%. On the average, a quarter of the first reflectivity sum $R_s^{PE}$ is about 93% as indicated by the hatched region in FIG. 4. The same amount of reflectivity losses occurs for the light originating from the x-poles PX1, PX2 around the x-direction in the equatorial zone on both deflecting mirrors. Therefore, there is virtually no effective reflectivity splitting, e.g., ΔR=0. Under these conditions, the light intensity poles in the pupil surface $P_{PO}$ of the projection objective have equal intensities if the corresponding poles in the pupil $P_{ILL}$ of the illumination system have equal intensities and no other effects influencing the intensity distribution occur. As a result, no intensity ellipticity is caused by the deflecting mirrors.

Figure 4:
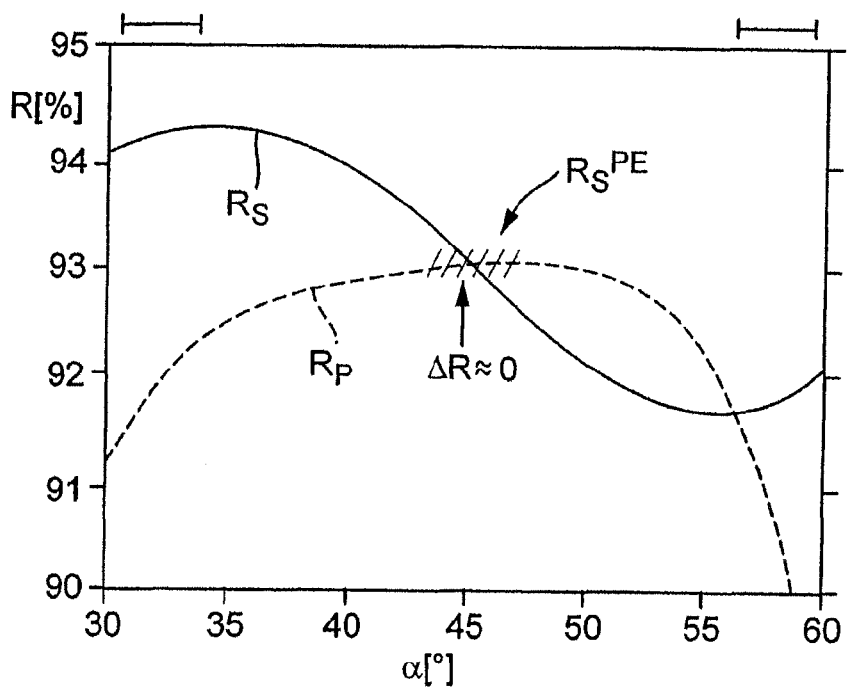
FIG. 4 is a diagram showing the dependency of reflectivities $R_s$ and $R_p$ for s-polarized and p-polarized light, respectively, on the angle of incidence $\alpha$, at a deflecting mirror coated with reflective coating according to a first embodiments of a reflective coating.

The reflective coatings having the general characteristics shown in FIG. 4 may also be used with other illumination modes without causing intensity ellipticity. As characteristics for reflectivity $R_s$ for s-polarization is basically point symmetric relative to the tilt angle t=45° of the deflecting mirror, a compensation of reflectivity losses is obtained in the y-direction for all σ values between the optical axis (α=45°) and the edge of the pupil (see condition in equation (3))

Furthermore, $R_s=R_s$ at α=45° for the reflective coating of FIG. 4. As a consequence, the reflective coating may also be used with unpolarized light without causing intensity ellipticity.

Another illumination mode which may be used in connection with a reflective coating discussed in connection with FIG. 4 is an illumination mode where a quadrupole setting generally in accordance with FIG. 1B or 1C with four poles having tangential polarization is used and where the effective source also contains significant intensity of unpolarized light around the optical axis, i.e., in the center region of the pupil (see FIG. 1D). The intensity around the optical axis does not cause significant ellipticity since the condition $R_p(45°)=R_s$ (45°) is fulfilled. This illumination mode may be useful to print patterns where isolated lines (e.g. for peripheral conduits in a chip design) are present in addition to a plurality of densely spaced lines with small periodicity.

Evidence of improved performance of an optical system provided with two deflecting mirrors having reflecting coatings with reflectivity characteristics as presented in connection with FIG. 4 is now presented in connection with FIG. 5. The optical performance of a reference system REF with two planar deflecting mirrors taken from a prior art system disclosed in FIG. 12 of EP 1 767 978 A1 (corresponding to WO 2005/124420 A1) is compared with a first embodiment EMB1 having the same optical design of the system as the prior art, and differing only in the structure of the reflective coatings of the two planar deflecting mirrors. While the deflecting mirrors of the reference system REF have the reflective coatings with layer structure Al/MgF$_2$/LaF$_3$/MgF$_2$ as disclosed in FIG. 12 of EP 1 767 978 A1 and corresponding description, the deflecting mirrors in the first embodiment EMB1 have reflecting coatings with a multi-layer structure as disclosed in Table 1 above and reflectivity properties as disclosed in connection with FIG. 4.

Imaging simulation was performed using commercial imaging simulation software SOLID E® provided by Synopsys, Inc., Mountain View, Calif. 94043, USA widely used in the field of optical microlithography for process development and optimization. For details see e.g. http://www.synnopsys.com/products/tcad/acqnr/sgmc/solide.html. SOLID E® is a Windows-based software package for simulating and modelling all the processes and techniques involved in optical microlithography. The software package is able to simulate the evolution of 3-dimensional topographical features in integrated circuit devices throughout the various phases in the microlithography process.

Test patterns were used having sub-patterns of parallel lines LI running in mutually perpendicular directions (x-direction and y-direction). A line width LW=45 nm was used for all test patterns in all simulations. The simulation mask was an attenuated phase shift mask having full transmission (100%) in the spaces between the lines LI and a residual transmission of 6% in the lines. In order to assess quantitatively orientation-dependent differences for the various structure directions (also denoted as H-V differences) printing was simulated for various patterns each having the same line width (45 nm) but different pitch, the pitch denoting the periodicity length for corresponding structures in the periodic sub-patterns (see FIG. 5B). Different pitch values 115 nm, 125 nm, 130 nm, 140 nm, 150 nm, 180 nm, 270 nm, 315 nm and 1000 nm were used to quantify the H-V differences. As used here, the H-V difference ΔHV [nm] is the difference in printed line width between lines of the same periodicity length (or pitch) in mutually perpendicular directions.

The values for ΔHV were calculated by simulating the imaging process for a given structure (pattern) with parallel lines oriented once in the x direction and then in the y direction. Using the same illumination dose for all simulations the respective linewidths can be determined from the aerial image applying the same intensity threshold value in a given photosensitive material (e.g., resist). If the printed linewidth in x-direction is $LW_x$ and the printed linewidth in y-direction is $LW_y$, then $\Delta HV=LW_x-LW_y$.

Illumination was simulated by using an annular setting (having a ring-shaped effective light source in the pupil surface of the illumination system), the relative radial position of the inner and outer edge of the ring-shaped effective light source being characterized by $\sigma_i$=0.82 and $\sigma_o$=0.97 (compare, e.g., FIG. 1B or 1C for the definition of the σ value). Unlike the quadruple setting shown in FIG. 1B, the annular setting of the simulation is not subdivided in four segments, but is characterized by a complete closed ring of illumination, with no interruption in azimuthal direction. The image-side numerical aperture NA of the projection objective was set at NA=1.3. The polarization properties of the illumination radiation were set to correspond to a "xy polarization state" characterized by the fact that the illumination pupil was subdivided into four 90° wedge-shaped sectors centred about the x- and y-axis, respectively such that the borders between adjacent sectors were running at 45° symmetrically between x- and y-axes. In each of the sectors the radiation was simulated to have linear polarization with electric field vector oscillating perpendicular to the middle axis of the respective sector to provide essentially tangential polarization of a type similar to that shown in FIG. 1C.

Figure 5A:
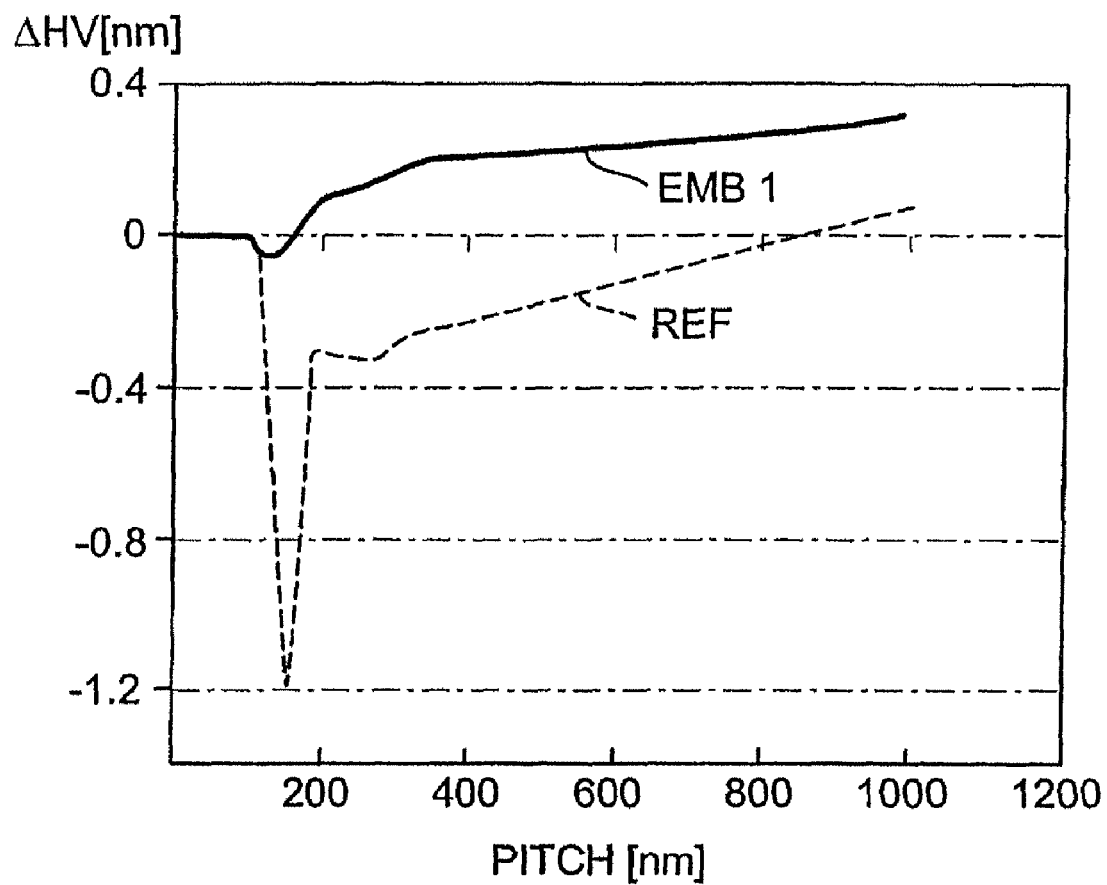
FIG. 5 shows in 5A a comparative diagram with results of imaging simulations regarding H-V-differences at different line periodicities (pitch) generated by a reference system REF and a first embodiment EMB1 of the disclosure when test patterns schematically depicted in 5B are used.
Figure 5B:
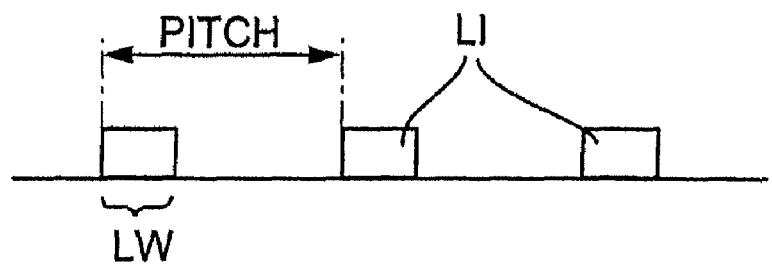

FIG. 5A shows the simulation results in a diagram having the pitch [nm] of the sub-patterns on the x-axis and the corresponding horizontal-vertical difference ΔHV [nm] on the y-axis, where the dashed curve REF corresponds to the values for the reference system and the solid curve EMB1 corresponds to the values of the first embodiment (reflective coatings as shown in FIG. 4). Both curves were normalized to have ΔHV=0 nm at 100 nm pitch. It is evident that ΔHV shows a significant variation with pitch particularly in the region of the critical fine structures characterized by small pitch values between about 100 nm and 200 nm to 400 nm, for example. The absolute value of the variation of ΔHV is about 1.2 nm between 100 nm and 200 nm pitch, for example. These relatively large values result in significant line width differences particularly in finely spaced patterns which are printed using illumination predominantly from the outer edge region of the illumination pupil.

A significant improvement of ΔHV is obtained when a reflective coating according to the embodiment of Table 1 in FIG. 4 is used. Since the variation of ΔHV with pitch is significantly smaller in the region of small pitch values, for example, ΔHV varies by only about 0.2 nm between about 100 nm pitch and 400 nm pitch indicating that densely spaced lines have very similar line width in both the x- and the y-direction in embodiments of the disclosure. In general, the variation of ΔHV may be 1.2 nm or less (e.g., 1 nm or less, 0.8 nm or less, 0.5 nm or less) in the pitch regime between about 100 nm and 1000 nm.

In some embodiments, a balanced reflective coating used on one or more deflecting mirrors in an optical system has a structure as presented in Table 2 below and FIG. 6. The structure is given in Table 2, where the meaning of the layer number #, the thickness d, the material, and the parameters n and k defining a complex refractive index $N=n-ik$ is the same as in Table 1. This embodiment is a purely dielectric multilayer system formed by a dielectric multilayer stack with alternate layers of low refractive index material (here: Chiolith) and high refractive index material (here: $Al_2O_3$) with 53 single layers. The first layer 1 formed directly on the substrate surface is a low refractive layer, the outer layer 53 adjacent to the environment is also low refractive Chiolith.

TABLE 2

| Layer # | d [nm] | material | n(193 nm) | k(193 nm) |
|---|---|---|---|---|
| 1 | 47.0 | CH | 1.38 | 0 |
| 2 | 29.2 | AL | 1.84 | 0.004 |
| 3 | 47.7 | CH | 1.38 | 0 |
| 4 | 28.9 | AL | 1.84 | 0.004 |
| 5 | 48.9 | CH | 1.38 | 0 |
| 6 | 29.4 | AL | 1.84 | 0.004 |
| 7 | 48.8 | CH | 1.38 | 0 |
| 8 | 30.0 | AL | 1.84 | 0.004 |
| 9 | 47.9 | CH | 1.38 | 0 |
| 10 | 30.2 | AL | 1.84 | 0.004 |
| 11 | 46.2 | CH | 1.38 | 0 |
| 12 | 29.9 | AL | 1.84 | 0.004 |
| 13 | 44.4 | CH | 1.38 | 0 |
| 14 | 29.6 | AL | 1.84 | 0.004 |
| 15 | 43.2 | CH | 1.38 | 0 |
| 16 | 29.3 | AL | 1.84 | 0.004 |
| 17 | 42.6 | CH | 1.38 | 0 |
| 18 | 29.1 | AL | 1.84 | 0.004 |
| 19 | 42.5 | CH | 1.38 | 0 |
| 20 | 28.8 | AL | 1.84 | 0.004 |
| 21 | 42.8 | CH | 1.38 | 0 |
| 22 | 28.4 | AL | 1.84 | 0.004 |
| 23 | 43.5 | CH | 1.38 | 0 |
| 24 | 27.9 | AL | 1.84 | 0.004 |
| 25 | 44.6 | CH | 1.38 | 0 |
| 26 | 27.1 | AL | 1.84 | 0.004 |
| 27 | 46.0 | CH | 1.38 | 0 |
| 28 | 26.2 | AL | 1.84 | 0.004 |
| 29 | 48.0 | CH | 1.38 | 0 |
| 30 | 24.9 | AL | 1.84 | 0.004 |
| 31 | 50.4 | CH | 1.38 | 0 |
| 32 | 23.4 | AL | 1.84 | 0.004 |
| 33 | 53.3 | CH | 1.38 | 0 |
| 34 | 21.4 | AL | 1.84 | 0.004 |
| 35 | 56.4 | CH | 1.38 | 0 |
| 36 | 19.3 | AL | 1.84 | 0.004 |
| 37 | 59.0 | CH | 1.38 | 0 |
| 38 | 17.5 | AL | 1.84 | 0.004 |
| 39 | 59.5 | CH | 1.38 | 0 |
| 40 | 16.8 | AL | 1.84 | 0.004 |
| 41 | 56.9 | CH | 1.38 | 0 |
| 42 | 17.1 | AL | 1.84 | 0.004 |
| 43 | 51.8 | CH | 1.38 | 0 |
| 44 | 17.4 | AL | 1.84 | 0.004 |
| 45 | 45.1 | CH | 1.38 | 0 |
| 46 | 16.7 | AL | 1.84 | 0.004 |
| 47 | 39.2 | CH | 1.38 | 0 |
| 48 | 15.0 | AL | 1.84 | 0.004 |
| 49 | 41.2 | CH | 1.38 | 0 |
| 50 | 15.3 | AL | 1.84 | 0.004 |
| 51 | 49.7 | CH | 1.38 | 0 |
| 52 | 19.1 | AL | 1.84 | 0.004 |
| 53 | 41.5 | CH | 1.38 | 0 |

Figure 6:
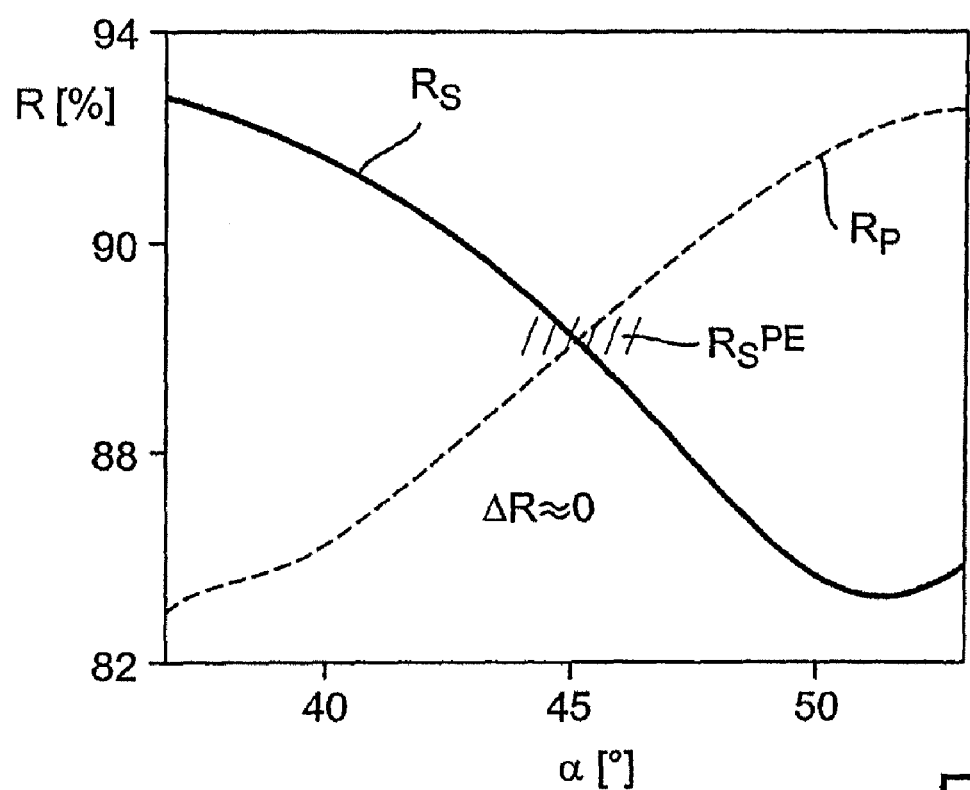
FIG. 6 is a diagram showing the dependency of reflectivities $R_s$ and $R_p$ for s-polarized and p-polarized light, respectively, on the angle of incidence $\alpha$, at a deflecting mirror coated with reflective coating according to a second embodiments of a reflective coating.

As seen in FIG. 6, the variation of reflectivity $R_s$ for s-polarized light with the angle of incidence is substantially point symmetric to the reflectivity value $R_s$ at $\alpha=45°$ corresponding to the tilt angle t of the deflecting mirror. Here $R_s(45°)\approx 89\%$. As the angle of incidence deviates from the tilt angle towards smaller values, the reflectivity increases approximately linearly up to $\alpha=40°$ and smaller, whereas reflectivity decreases by about the same amount down to about 83% at about $\alpha=50°$, with a local minimum at about $\alpha=51°$. In general, the condition $$R_s(t+\delta\alpha)+R_s(t-\delta\alpha)=R_s(t)\pm 0.5\%$$

is obeyed for $\delta\alpha$ from about 0° to about 10°.

The reflectivity $R_p$ for p-polarized light has essentially the opposite, point symmetrical behaviour, with $R_p \approx R_s$ at about $\alpha=45°$. As the angles of incidence decrease towards smaller values, $R_p$ decreases down to about 83% at $\alpha=40°$. On the other hand, $R_p$ increases about linearly up to about $R_p\approx 92\%$ at $\alpha=50°$ such that the condition $$R_p(t+\delta\alpha)+R_p(t-\delta\alpha)=R_p(t)\pm 0.5\%$$

is obeyed for $\delta\alpha$ from 0° to 10°.

The reflectivity properties of this reflecting coating are therefore not only substantially point symmetric to the reflectivity value $R_{s(t)}=45°$ for s-polarized light, but also for p-polarized light. Particularly, the conditions presented in equations 4, 6 and 7, namely $$(R_p(t+\delta\alpha)+R_p(t-\delta\alpha))/2=R_s(t)\pm 2\% \quad (4)$$

$$(R_p(t-\Delta\alpha)+R_p(t+\Delta\alpha))/2=R_s(t)\pm 0.5\% \quad (6)$$

$$R_p(t)=R_s(t)\pm 0.5\% \quad (7)$$

are obeyed at least for angles of incidence between about 40° and about 50° ($\Delta\alpha=5°$ or more for $t=45°$) in addition to the conditions presented in equations 1 to 3 and 5. As a result, this type of coating can be used with tangential polarization as well as radial polarization or with unpolarized light essentially without introducing intensity ellipticity for either of the mentioned polarization dates.

Figure 7:
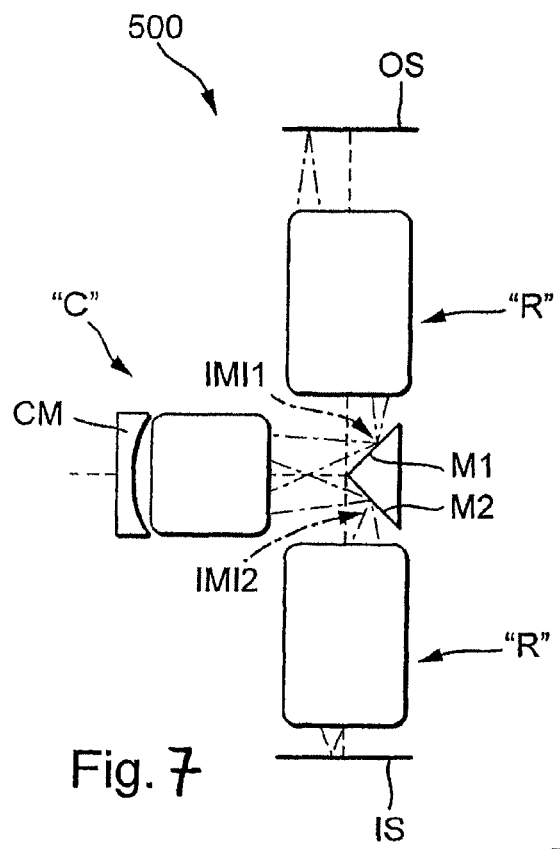
FIG. 7 shows a schematic of a first embodiment of a catadioptic projection objective including deflecting mirrors in accordance with an embodiment of the disclosure.
Figure 8:
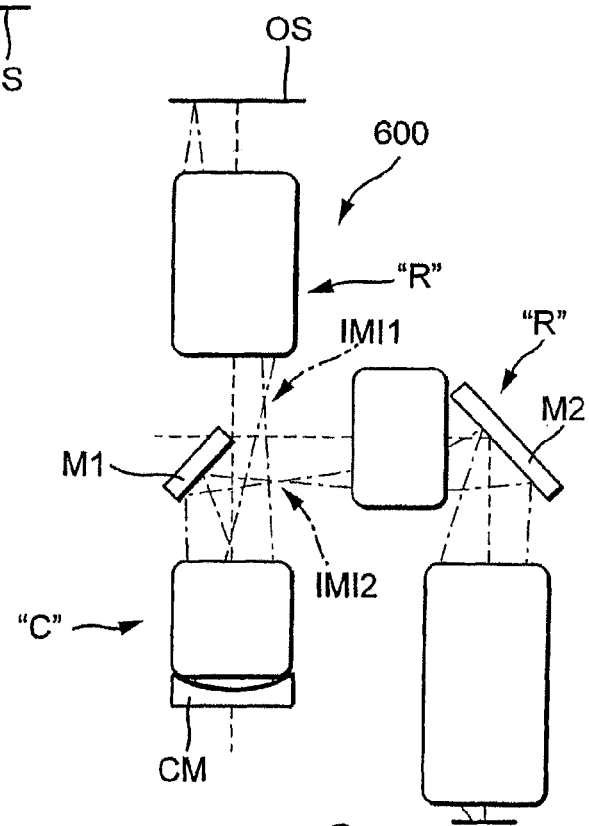
FIG. 8 shows a schematic of a second embodiment of a catadioptic projection objective including deflecting mirrors in accordance with an embodiment of the disclosure.

Embodiments of deflecting mirrors may be used in various type of catadioptric projection objectives. For example, FIGS. 7 and 8 show schematically embodiment of R-C-R type projection objectives designed to image a pattern from an object surface OS onto an optically conjugated image surface IS using three cascaded (or concatenated) imaging objective parts and exactly two intermediate images. A first refractive objective part (abbreviation "R") generates a first real intermediate image IMI1 of the pattern. A second, catadioptric objective part (abbreviation "C") including a concave mirror generates a real second intermediate image IMI2 from the first intermediate image. A third, refractive objective part (abbreviation "R") images the second intermediate image into the image surface. Typically, the first, refractive objective part has a magnification close to 1:1 and serves as a "relay" system to define the size, position and correction status of the first intermediate image properly for the subsequent imaging steps. Both embodiments utilizing off-axis fields to obtain an image free of vignetting and obscuration use a single concave mirror CM positioned at or optically close to the pupil surface of the second objective part in combination with one or more negative lenses arranged ahead of the concave mirror to correct axial chromatic aberration (CHL) and Petzval sum. The third objective part typically is optimized as a focusing group with densely packed lenses to obtain a major part of demagnification and the desired image-side NA.

In projection objective 500 of FIG. 7 a first planar deflecting mirror M1 is arranged to deflect light coming from the object surface OS and the first intermediate image IMI1 towards the concave mirror CM, whereas the second planar deflecting mirror M2 is arranged optically close to the second intermediate image IMI2 and guides the light reflected from the concave mirror towards the image surface. Examples of this general construction are found, for example, in WO 2005/111689 A2, WO 2005/124420 A1 or WO 2005/124420 A1.

In projection objective 600 of FIG. 8, light coming from the object surface via the first intermediate image IMI1 is incident on the concave mirror CM prior to impinging on the planar first deflecting mirror M1, which deflects light coming from the concave mirror towards the image surface. A second planar deflecting mirror M2 optically downstream of the second intermediate image and oriented perpendicular to the first deflecting mirror allows to orient the image surface IS parallel to the object surface. Embodiments of this general construction are disclosed, for example, in US 2004/0233405 A1.

In some embodiments, projection objectives can have only one intermediate image, such as shown in WO 2004/025370 A1 or US 2006/0077366 A1, or more than two intermediate images, e.g. as disclosed in WO 2005/040890 A2 or US 2005/0185269 A1.

A number of embodiments have been described. Other embodiments are in the claims.

What is claimed is:

1. A projection objective having an object surface and an image surface, the projection objective comprising:
    a plurality of optical elements arranged along an optical axis and configured so that during operation the projection objective images a pattern arranged in the object surface onto the image surface, the optical elements comprising:
    a concave mirror;
    a first deflecting mirror tilted relative to the optical axis by a first tilt angle, $t_1$, about a first tilt axis so that during operation the first deflecting mirror deflects light at a wavelength λ from the object surface towards the concave mirror or deflects light at λ from the concave mirror towards the image surface; and
    a second deflecting mirror tilted relative to the optical axis by a second tilt angle, $t_2$, about a second tilt axis,
    wherein for a pattern comprising a grating having a line width of 45 nm and a pitch, p, the projection objective images the pattern to the image surface such that for a first orientation of the pattern and a second orientation of the pattern a difference, ΔHV, between the imaged line width is 1.2 nm or less for 100 nm<p<1,000 nm, where the grating lines in the first orientation are orthogonal to the grating lines in the second orientation.

2. The projection objective of claim 1, wherein ΔHV is 1 nm or less for for 100 nm<p<1,000 nm.

3. The projection objective of claim 1, wherein ΔHV is 0.5 nm or less for for 100 nm<p<1,000 nm.

4. The projection objective of claim 1, wherein ΔHV is 1.2 nm or less for for 100 nm<p<400 nm.

5. The projection objective of claim 1, wherein 100 nm≦λ≦260 nm.

6. The projection objective of claim 1, wherein the projection objective comprises two or more cascaded imaging objective parts and during operation forms one or more intermediate images of the pattern.

7. The projection objective of claim 1, wherein the projection objective comprises a single concave mirror positioned at or optically close to a pupil surface of a catadioptric objective part in combination with one or more negative lenses arranged ahead of the concave mirror.

8. The projection objective of claim 1, wherein the projection objective comprises:
    a first objective part configured so that during operation the first refractive objective part generates a first real intermediate image of the pattern, the first objective part being a refractive objective part;
    a second objective part comprising a concave mirror, the second objective part being configured so that during operation the second objective part generates a real second intermediate image from the first intermediate image, the second objective part being a catadioptric objective part; and
    a third objective part configured so that during operation the third objective part images the second intermediate image into the image surface, the third objective part being a refractive objective part.

9. The projection objective of claim 8, wherein the first deflecting mirror is arranged optically close to the first intermediate image and configured so that during operation the first deflecting mirror deflects light coming from the object surface towards the concave mirror; and
    the second deflecting mirror is arranged optically close to the second intermediate image and configured so that during operation the second deflecting mirror deflects light reflected from the concave mirror towards the image surface.

10. The projection objective of claim 8, wherein the projection objective is configured so that during operation light coming from the object surface via the first intermediate image is incident on the concave mirror prior to impinging on the first deflecting mirror, the first deflecting mirror deflects light coming from the concave mirror towards the image surface, and the second deflecting mirror is arranged optically downstream of the second intermediate image and is oriented perpendicular to the first deflecting mirror such that the image surface is oriented parallel to the object surface.

11. The projection objective of claim 1, wherein the projection objective is an immersion projection objective configured to operate at an image-side numerical aperture NA>1.

12. A method, comprising:
    a) providing the projection objective of claim 1; and
    b) using the projection objective to project an image of a pattern of a mask onto a photosensitive substrate.

13. The method of claim 12, further comprising, between a) and b), illuminating the pattern of the mask with illumination light.

14. The method of claim 13, wherein the illumination light is ultraviolet light.

15. The method of claim 13, wherein the pattern is illuminated with illumination light from an effective source formed by an intensity distribution at a pupil plane of an illumination system corresponding to an off-axis illumination mode comprising four off-axis illumination poles.

16. The method of claim 15, wherein the illumination light has tangential polarization in the illumination poles.

17. The method of claim 16, wherein the intensity distribution at the pupil plane of the illumination system includes a central pole on an optical axis, where illumination light in the central pole is substantially unpolarized.

18. An apparatus, comprising:
an illumination system; and
a projection objective according to claim 1,
wherein the apparatus is a projection exposure apparatus.

19. The apparatus of claim 18, wherein:
the illumination system is configured so that, during use of the apparatus, the illumination system generates illumination light and the illumination light is incident on a mask bearing a pattern; and
the projection objective is configured so that, during use of the apparatus, the projection objective projects an image of the pattern of the mask onto a light-sensitive substrate.

20. The apparatus of claim 18, further comprising a light source configured to generate primary light during operation of the projection exposure apparatus.

* * * * *

UNITED STATES PATENT AND TRADEMARK OFFICE
CERTIFICATE OF CORRECTION

PATENT NO. : 8,411,356 B2
APPLICATION NO. : 13/217793
DATED : April 2, 2013
INVENTOR(S) : Ralf Mueller It is certified that error appears in the above-identified patent and that said Letters Patent is hereby corrected as shown below:

In the Specification

Column 2,
Line 47, delete "differering" and insert --differing--

Column 4,
Line 59, delete "eqatorial" and insert --equatorial--

Column 7,
Line 4-5, delete "porarization" and insert --polarization--
Line 6, delete "axis)" and insert --axis).--
Line 20, delete "quadropole" and insert --quadrupole--
Line 53, delete "Mircrostructured" and insert --Microstructured--

Column 8,
Line 48-49, delete "catadioptic" and insert --catadioptric--
Line 52, delete "catadioptic" and insert --catadioptric--

Column 10,
Line 53, delete "eqatorial" and insert --equatorial--

Column 15,
Line 18, delete "(3))" and insert --(3)).--
Line 35, delete "densly" and insert --densely--
Line 58, delete ".synnopsys." and insert --.synopsys.--

Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,411,356 B2

In the Claims

Column 19,
Line 59, after "for" delete "for". (Second Occurrence)
Line 61, after "for" delete "for". (Second Occurrence)
Line 63, after "for" delete "for". (Second Occurrence)